US007302554B2

(12) United States Patent
Yamazaki

(10) Patent No.: US 7,302,554 B2
(45) Date of Patent: Nov. 27, 2007

(54) METHODS AND APPARATUS FOR MULTI-PROCESSOR PIPELINE PARALLELISM

(75) Inventor: Takeshi Yamazaki, Tokyo (JP)

(73) Assignee: Sony Computer Entertainment Inc. (JP)

( * ) Notice: Subject to any disclaimer, the term of this patent is extended or adjusted under 35 U.S.C. 154(b) by 247 days.

(21) Appl. No.: 11/108,959

(22) Filed: Apr. 19, 2005

(65) Prior Publication Data

US 2005/0251648 A1    Nov. 10, 2005

Related U.S. Application Data

(60) Provisional application No. 60/564,682, filed on Apr. 22, 2004.

(51) Int. Cl.
*G06F 9/30* (2006.01)

(52) U.S. Cl. .................... 712/214; 712/226; 712/32
(58) Field of Classification Search ............ 712/214, 712/226, 32
See application file for complete search history.

(56) References Cited

U.S. PATENT DOCUMENTS 6,289,434 B1 * 9/2001 Roy ........................... 712/32
6,826,662 B2 * 11/2004 Suzuoki et al. ............. 711/156

FOREIGN PATENT DOCUMENTS

WO    WO-03/046712    6/2003

OTHER PUBLICATIONS

Silc J. et al, "A Survey Of New Research Directions in Microprocessors", Microprocessors and Microsystems, Aug. 1, 2000, pp. 175-190, ISSN 0141-9331, IPC Business Press Ltd., London, GB.
Diep T. A. et al, "EXPLORER: A Retargetable And Visualization-Based Trace-Drive Simulator for Superscalar Processors", Microarchitecture, 1993, Proceedings Of The 26th Annual International Symposium On Austin, TX, USA, Dec. 1, 1993, IEEE Comput. Soc, US, pp. 225-235, XP010097281, ISBN: 0-8186-5280-2, Los Alamitos, CA, USA.

* cited by examiner

*Primary Examiner*—Alford Kindred
*Assistant Examiner*—Vincent Lai
(74) *Attorney, Agent, or Firm*—Lerner, David, Littenberg, Krumholz & Mentlik, LLP

(57) ABSTRACT

A processor is provided which has a modular organization including at least one local store operable to store data and instructions for execution, at least one functional unit operable to execute instructions on data provided from the local store, and at least one issue logic unit operable to convert instructions provided from the local store into operations of the functional unit for executing the instructions. The at least one issue logic unit may be operable to decode a unitary instruction provided from the local store to simultaneously operate all of the functional units according to the unitary instruction. Each issue logic unit may be operable to decode multiple instructions to separately operate first and second subsets of the plurality of functional units according to respective ones of the multiple instructions.

10 Claims, 8 Drawing Sheets

METHODS AND APPARATUS FOR MULTI-PROCESSOR PIPELINE PARALLELISM

CROSS-REFERENCE TO RELATED APPLICATIONS

This application claims the benefit of the filing date of U.S. Provisional Patent Application No. 60/564,682 filed Apr. 22, 2004, the disclosure of which is hereby incorporated herein by reference.

BACKGROUND OF THE INVENTION

The present invention relates to integrated circuits and their design.

In recent years, the design of integrated circuit processors has shifted from standalone proprietary designs to designs which support greater networking capability and interoperability with competing designs and legacy platforms. This coincides with a realignment of the computing world with network server computers, replacing the traditionally dominant standalone PCs.

Accordingly, it is no longer enough to provide a processor having the highest standalone performance. The processor must be adept at handling the computing job at hand, which means efficiently responding to processing calls. A processor design that supports calls arriving from a variety of differently designed processors of different vendors would be superior, as it would offer a greater degree of interoperability. However, among such designs, higher performance would be achieved when the processors in a network, be they large or small, server or client, share common design features, as described in commonly owned U.S. patent application Ser. No. 09/815,554, filed Mar. 22, 2001, which is hereby incorporated by reference herein. Such common designs may utilize a common architecture having a common instruction set architecture (ISA) or subportions thereof, and a common design for data paths and addressing. Such common designs may also support high execution rates for jobs such as the serving and/or processing of graphics data. Such designs would support interoperability while promoting the high performance benefits of a shared design.

In designing processors for such purpose, an efficient processor organization and design method are needed. A relatively short design cycle should be realized, regardless of the size of the processor, or the computing job that it is designed to support. The processor design should be capable of being changed while continuing to implement a common instruction set architecture. Moreover, the processor design should be capable of being changed close to the time that it is released to manufacturing on an integrated circuit (IC) without requiring large-scale redesign of the processor and without requiring large-scale redesign of microcode and hardware to implement the instruction set on the changed processor.

FIG. 1 is a flow diagram illustrating a processor implementation method according to the prior art. As shown in FIG. 1, an initial step S01 in the design of a processor includes designing a new instruction set architecture and/or extensions to an existing instruction set architecture, both of which are collectively referred to herein as "ISA". The instruction set architecture is a collection of machine-language instructions that the processor is required to recognize and execute whenever such instructions are presented to the processor. An ISA typically includes instructions for storing and retrieving data, storing and retrieving instructions, and for mathematically, logically or otherwise manipulating operands and other instructions held in one or more registers of the processor. The ISA is typically detailed to a point in which only a particular processor or class or processors is capable of executing the instructions thereof. Details of the ISA include the data width of bits to be retrieved from storage per access, and types of fetch commands by which data bits can be accessed directly. In addition, support for movement of data between registers of the processor and different levels of storage, e.g. different levels of cache, are typically specific to a processor design or class of processors. As a further example, while processors having different organizations are capable of executing floating point operations, only processors belonging to a particular class of processors are capable of executing floating point operations in which the mantissa has a length of 32 bits, the exponent has length of 16 bits, and the two's complement is used to indicate the sign of a number.

In this method according to the prior art, after the ISA is designed, the processor is then custom designed (step S03) to have a fixed functional organization which supports the design of the ISA. The ISA including any extensions thereof is typically designed to such detail that it can only be implemented by processor hardware having a very specific functional organization. As discussed above, as an example, the bit width for transferring data to and from registers of the processor, and the bit width of operands capable of manipulation by the processor are typically fixed by the instructions included within the ISA. Accordingly, the design of the processor reduces to a process of designing fixed hardware and/or microcode support for the instructions of the ISA.

Thereafter, at step S05, issue logic and microcode are custom-designed to implement the instructions on the processor hardware designed therefor. Issue logic is used to convert an instruction having a symbol of limited bitwidth (e.g. 32 bits of character data) recognizable by the processor and by a human or machine-based programmer (compiler) to a set of electrical signals which turn on and turn off various elements of the processor hardware, as needed to execute the instruction. Such symbol to signal conversion is typically performed either by hardware or in firmware by look-up of stored data representing such signals. For example, a microcoded instruction is implemented by data stored in a control store which represents such signals. The stored data is fetched, as from a control store, upon recognition of the symbol for a particular instruction and is then used to provide the signals which execute the instruction on the processor. According to the prior art method, the design of the issue logic and the microcode are generally performed subsequent to the design of the hardware because they are dependent upon choices made during the hardware design.

However, in the design method according to the prior art, a problem exists when seeking to modify the design of the processor. At step S03, the processor is designed having a fixed functional organization to support the ISA. The issue logic and microcode are then custom-designed to implement the ISA on the custom-designed processor. However, because of their custom-design, when the design of the processor is modified, the issue logic and microcode previously designed therefor might no longer work in the modified processor design. Accordingly, whenever a decision is made to modify the design of the processor (S06), the process flow returns to the step of the processor design at S03, reflecting that a change in the processor design can require changes in the design of issue logic and microcode to implement the ISA on the modified processor design.

In addition to the above considerations, two existing methodologies are provided by the prior art for designing processors according to step S03 of the above-described method: synthetic design, and custom design. These design methodologies find particular application to the design of processor "cores", i.e., processor elements of integrated circuits that have additional function. An integrated circuit classified as a system-on-a-chip ("SOC") has a processor core.

In the synthetic design approach, as illustrated in FIG. 2, a library of reusable component blocks is developed a priori, as shown at S10, the library being available for designing many varieties of circuits for use in systems having a range of clock speeds and purposes. The reusable component blocks are defined by relatively high-level language, for example, a register transport level ("RTL") description. The designer then assembles the processor design by specifying the component blocks for use therein, as shown at S12. A compiler synthesizes a circuit layout from the component blocks specified in the RTL description. Synthetic design provides flexibility to modify essential features of the processor during the design cycle such as the instruction set, the width of pipelines, and the size of the cache. Such modifications are made by specifying a different set of reusable component blocks in the RTL description, as shown at S14. Synthetic design also allows designs to be created and ready for testing (at a pre-hardware stage) within a relatively short design cycle.

Custom design, on the other hand, is painstaking, requiring a relatively long design cycle. As illustrated in FIG. 3, in a full custom design of a processor, the elements of the processor are designed from the bottom level up, including all functional blocks, as shown at S20. Circuits are handcrafted to specific performance criteria, e.g., to support a minimum clock frequency, to consume less than a certain limit of power, or to occupy less than a certain limit of integrated circuit area. The layout and wiring between functional blocks are also carefully designed to meet the performance criteria, as shown at S22. Because of the greater attention given to each element of the design and the specific emphasis on meeting performance criteria, up to four times greater performance can be achieved when custom designing a processor versus creating the design synthetically. On the other hand, modifying the custom design poses difficulties, because it requires re-designing the processor again from the bottom level up, as shown at S24.

Moreover, as indicated above with reference to FIG. 1, a modification to the processor design forces reevaluation and redesign of the issue logic and microcode to implement the ISA on the modified processor design.

Accordingly, it would be desirable to provide a processor having a modular functional organization having capabilities determined according to a number of modular elements provided in the processor.

It would further be desirable to provide a method of designing a processor which does not require redesign of the issue logic and microcode when a change is made in the processor design, for example, a change in the number of functional units of the processor.

SUMMARY OF THE INVENTION

According to an aspect of the invention, a processor is provided which has a modular organization. The processor includes at least one local store operable to store data and instructions for execution, at least one functional unit operable to execute instructions on data provided from the local store, and at least one issue logic unit operable to convert instructions provided from the local store into operations of the functional unit for executing the instructions.

Each such issue logic unit is operable to control execution of the instruction by one or more functional units according to a common instruction set. When the processor includes a plurality of functional units, the at least one issue logic unit is operable to decode a unitary instruction provided from the local store to simultaneously operate all of the functional units according to the unitary instruction. Each issue logic unit is further operable to decode multiple instructions to separately operate first and second subsets of the plurality of functional units, wherein each subset is operated according to a respective one of the multiple instructions.

According to another aspect of the invention, a method of designing a processor is provided. According to such method, an instruction set architecture (ISA) is provided. A processor is designed having a modular functional organization which supports the ISA and issue logic is designed to implement the ISA on the processor, the issue logic accommodating changes in the modular functional organization.

DETAILED DESCRIPTION

The embodiments of the invention will now be described with reference to FIGS. 4 through 12.

Figure 4:
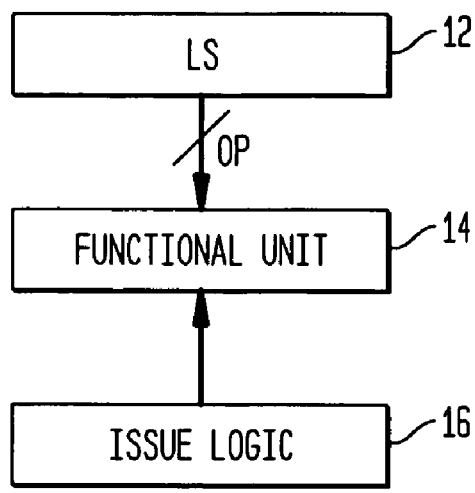
FIG. 4 is a block diagram illustrating organization of a processor according to an embodiment of the invention.

FIG. 4 is a block diagram illustrating the organization of a processor 10, as designed by a method according to an embodiment of the invention. As shown in FIG. 4, the processor includes three main elements, a local store 12, a functional unit 14, and issue logic 16. The local store (LS) 12 stores at least data and preferably instructions as well, for execution by the functional unit 14. The functional unit 14 executes instructions upon operands having a width of OP bits, which is a bus width for transfers of data to and from the local store 12. The number of bits OP that can be handled by the functional unit 14 varies by the design of the processor 10. In a particular embodiment, the number of bits OP are an integral multiple of a power of 2, for example, 4, 8, 16, 32 or 64 bits. The functional unit 14 executes instructions upon operands provided thereto from the local store 12.

The issue logic 16 serves to convert instructions queued for execution into signals that operate the functional unit 14. For example, an instruction to multiply two operands in the functional unit is converted into a sequence of operations, each of which shifts one operand to the left a number of places determined by a bit of the second operand. Thereafter, to complete the multiplication, the results of the shifting operations are added together, with carry.

Figure 5:
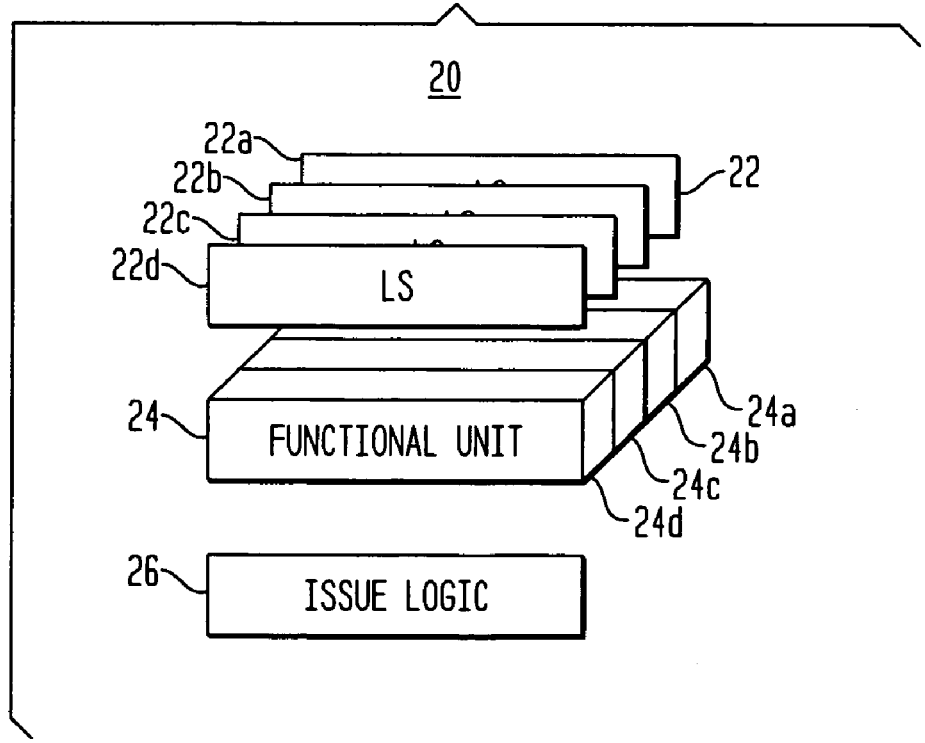
FIG. 5 is a block diagram illustrating organization of a processor according to another embodiment of the invention.

FIG. 5 illustrates the organization of another processor 20, as provided according to an embodiment of the invention. Like the processor 10 shown in FIG. 4, the processor 20 includes issue logic 26 for converting instructions into signals to control their execution by a functional unit. However, unlike the processor 10, processor 20 includes a plurality of local stores (LS) 22, as shown at 22a through 22d, and a plurality of functional units 24, as shown at 24a though 24d. Each local store 22 provides a storage space aligned to a corresponding functional unit and supplies at least operands thereto. For example, local store 22a provides a storage space aligned to functional unit 24a, and local store 22b provides a storage space aligned to functional unit 24b. Each local store preferably also supplies instructions to be executed by the corresponding functional unit 24. Although preferably implemented in a single integrated circuit, the local stores (LS) 22 and functional units 24 of processor 20 are design elements or components that are reused from the design of processor 10. Thus, for example, in this embodiment, the processor 20 includes four functional units, each of which executes instructions upon 32 bit wide operands, as well as four aligned local stores, each of which provides access to 32 bit wide operands. In addition, the processor 20 includes issue logic 26 which handles instructions which simultaneously operate upon 128 bit wide groups of operands. In such case, instructions can be queued for "multi-scalar" execution as to multiple (up to four) different streams of 32 bit operands. Such multi-scalar execution can be provided by cycle-by-cycle multiple threaded execution, as will be described more fully below. In such multi-scalar execution, two or more subsets of the functional units of the processor are separately operated according to different ones of multiple instructions which are provided to the processor, as described in commonly assigned, U.S. Provisional Application No. 60/564,673 filed on Apr. 22, 2004 entitled: "Multi-Scalar Extension for SIMD Instruction Set Processors," which application is hereby incorporated herein by reference.

Alternatively, the width of the data path through processor 20 is potentially increased by factors of two, three, or four from 32 bits to 64 bits, 96 bits or 128 bits, when operands are queued from the respective local stores 22 and operated upon simultaneously by the same instruction to provide single instruction multiple data (SIMD) operation.

Figure 6:
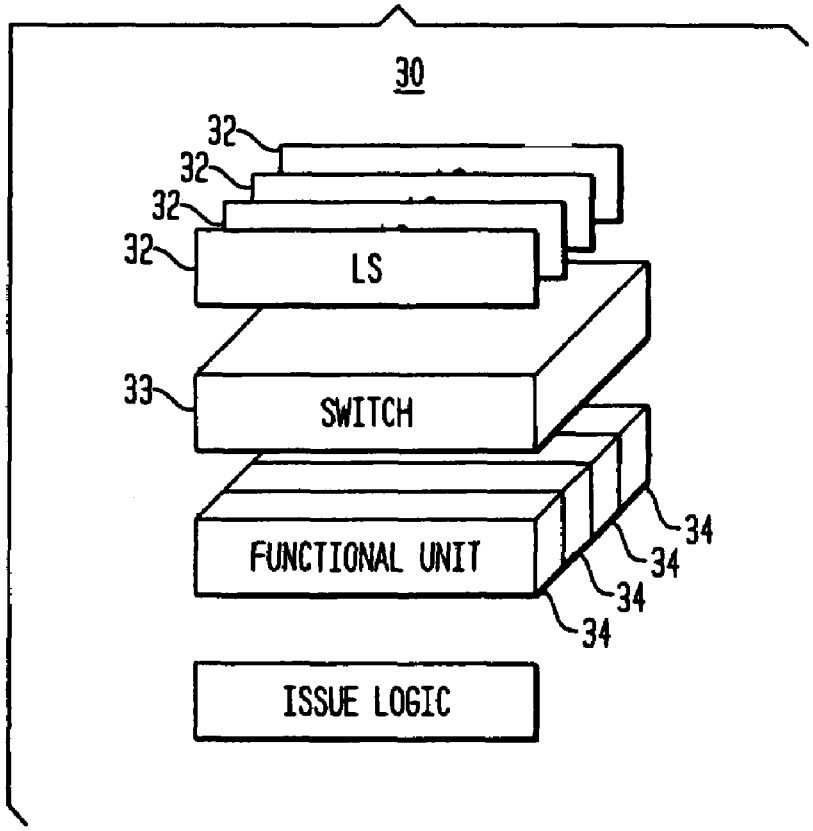
FIG. 6 is a block diagram illustrating organization of a processor according to yet another embodiment of the invention.

FIG. 6 illustrates the organization of a processor 30 according to another embodiment of the invention. The embodiment shown in FIG. 6 differs from that shown in FIG. 5 in the interposition of a switch 33 between the local stores (LS) 32 and the functional units 34. Switch 33 provides an interconnection network such that data including operands and/or instructions are capable of being retrieved from any one of the local stores (LS) 32 and provided to any one of the functional units 34. Desirably, the interconnection network is of the cross-bar type, so as to permit multiple simultaneous transfers of data between as many as all four of the local stores 32 and all four of the functional units 34.

Figure 7:
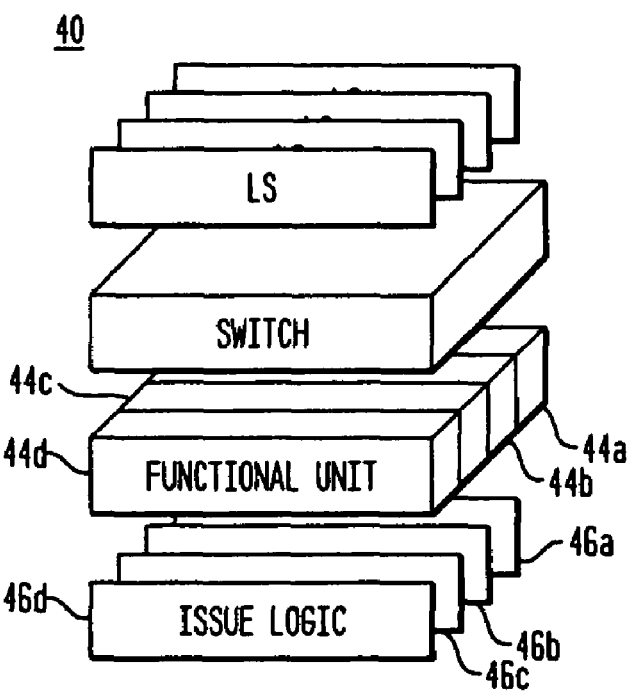
FIG. 7 is a block diagram illustrating organization of a processor according to yet another embodiment of the invention.

FIG. 7 illustrates the organization of a processor 40 according to another embodiment of the invention. The embodiment shown in FIG. 7 differs from that shown in FIG. 6 in that a plurality of issue logic units 46a through 46d are provided. Each of the issue logic units 46a through 46d is associated with a corresponding one of the functional units 44a through 44d. By default, each issue logic unit, e.g. issue logic unit 46a, decodes an instruction for the corresponding functional unit, e.g. functional unit 44a. The decoded instruction is then executed by the corresponding functional unit. In such manner, multiple instructions are simultaneously decoded by respective ones of the issue logic units 46 and then executed simultaneously on respective data by corresponding ones of the functional units 44. However, each issue logic unit can also function to decode an instruction for simultaneous execution of that instruction on respective data by all of the functional units 44a through 44d, i.e., for SIMD operation.

Figure 8:
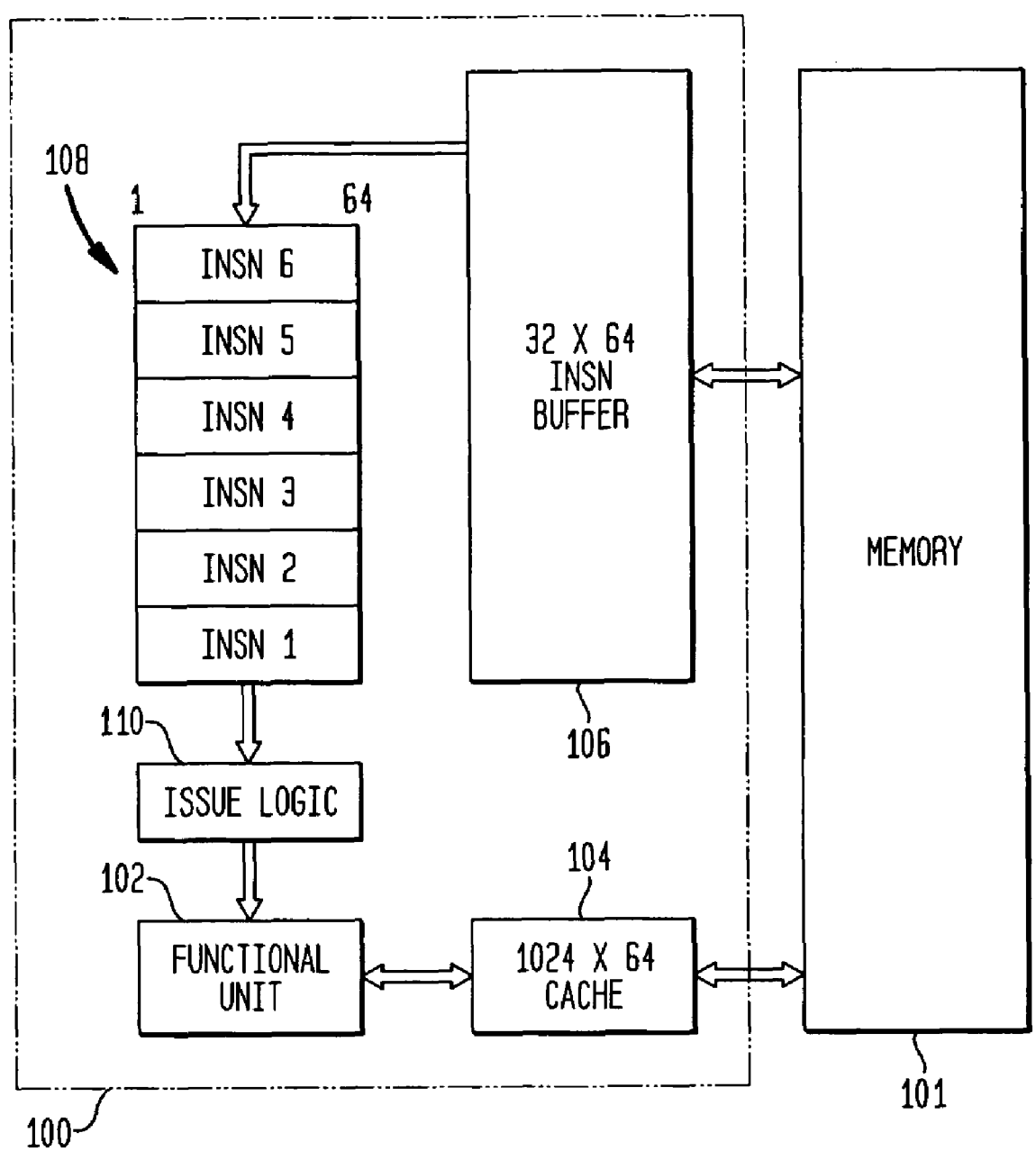
FIG. 8 is a detailed block diagram illustrating a detailed organization of a processor according to the embodiment of the invention illustrated in FIG. 4.

FIG. 8 is a detailed block diagram illustrating the organization of a processor 100 provided according to the embodiment of the invention shown in FIG. 4. As shown in FIG. 8, the processor 100 includes a functional unit 102, and a cache 104 coupled thereto, the cache 104 serving as a repository for data which are the operands and results of operations executed by the functional unit 102. The processor 100 further includes an instruction buffer 106, from which instructions are delivered into a pipeline 108, for conversion by issue logic 110 into signals for operating the functional unit 102. As further shown in FIG. 8, the processor 100 interfaces to a memory 101 through the cache 104 and the instruction buffer 106. The memory 101 stores data and instructions for execution by processor 100. The processor 100 also stores the results of executing instructions. In addition, if the instructions contain any statements that require interpretation prior to execution, the memory 101 may be used to store further instructions generated as a result of interpreting such statements by the processor 100.

In the example illustrated in FIG. 8, the data path of the cache 104 to and from the processor has width of one double-word (64 bits). The instruction pipeline 108 accommodates instructions that have a width of a double word (64 bits in width). In an embodiment, the cache accommodates 1024 such double words.

The instruction buffer 106 holds instructions fetched from memory 101 for placement in the queue of the instruction pipeline 108. In an embodiment of the invention, the instruction buffer 106 holds a modest number, for example, 32 instructions each having a width of one double word. Instruction buffers having a smaller or greater capacity can be provided, as needed for the particular application that the processor 100 supports. Preferably, the instruction buffer 106 provides first-in-first-out (FIFO) operation for queuing instructions fetched from memory 101 for output to instruction pipeline 108, and provides random access as well, to permit instructions to be executed out of the buffered order, as for branching operations.

The instruction pipeline 108 queues a number of instructions for execution from the instructions available in the instruction buffer, such number being six in the example shown in FIG. 8. The instruction pipeline 108 supports a traditional single-threaded approach, in which each instruction (INSN 1, INSN 2, INSN 3, etc.) in the pipelined is from a single stream of instructions and follows, in order, the last previous instruction in the stream of instructions.

The depth of the instruction pipeline 108 is determined primarily by the requirements of the particular processor organization. An instruction pipeline 108 which queues six instructions, as shown here, needs six instruction cycles to process each instruction for conversion into signals that operate the functional unit 102. One or more of these cycles are generally used to check for dependency of an instruction upon the results of an earlier executed instruction. If an instruction is discovered to have such dependency, the results of the earlier executed instruction must be readied for retrieval from cache, or if not available in the cache 104, then from the memory 101.

Occasionally, the results of executing an earlier instruction in the stream are not available in either the cache or the memory 101 at the time of the dependency check, but rather, such results are disposed somewhere "in between" the cache 104 and the memory 101. Stated another way, the data are in process of being transferred from the cache or the memory to the other, and neither storage location permits access to the data at that particular point in time. At such time, few options exist for proceeding. According to one option, the functional unit 102 stalls by performing a series of wait cycles until the data becomes available in the cache and provided to the functional unit 102 for execution of the instruction. This is undesirable, because many processor cycles can be wasted waiting for the data to be ready. Another option is for the current instruction stream to be suspended, and the processor 100 immediately begin loading another instruction stream into the buffer 106 and into the instruction pipeline 108 for execution. However, this option is also undesirable, because many cycles are needed for instructions to be loaded into the buffer 106 and readied for execution in the instruction pipeline 108.

Figure 9:
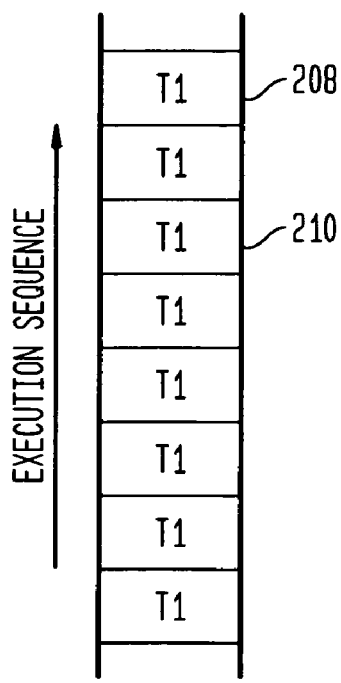
FIG. 9 is a diagram illustrating structure and function of a single-threaded instruction pipeline element of a processor according to an embodiment of the invention.

FIG. 9 illustrates a sequence of execution of instructions held in an instruction pipeline 208. As illustrated in FIG. 9, each instruction in the pipeline 208 is identified by a thread number T1. The thread number T1 identifies a particular sequence of related instructions that have been retrieved from memory. As commonly understood by those having skill in the art, each instruction of a thread often relates to the same work item as the last prior instruction, such that the work item is performed by executing the instructions of a particular thread in sequence. FIG. 9 illustrates the case in which all instructions in a pipeline 208 at a particular point in time are sequentially ordered instructions of a single thread T1. In such arrangement, from time to time, execution of a particular thread may cease, and execution of another thread will begin in its place. Other than such occasional changes between threads, the model shown in FIG. 9 represents an order in which instructions of threads are executed by a processor having a single-threaded instruction pipeline 208. Stated another way, execution of the instructions of a thread T1 is performed sequentially in order.

However, as noted above, such execution can be undesirable for various reasons. If an instruction, e.g. instruction 210, has dependency upon a result of a prior operation, that result must be available to the functional unit 102 (FIG. 8) at the time that instruction 210 is ready for execution, or else, instruction 210 cannot be executed. Consequently, when such dependency occurs, a common response can be to remove the current stream of instructions of the thread T1 from the instruction pipeline 208 and begin filling the pipeline 208 with the instructions of another thread T11 (not shown). As the instruction pipeline 208 has a depth of eight, the latency for reloading the pipeline is eight. Accordingly, at least eight cycles are wasted in reloading the instruction pipeline during such changeover between threads.

Figure 10:
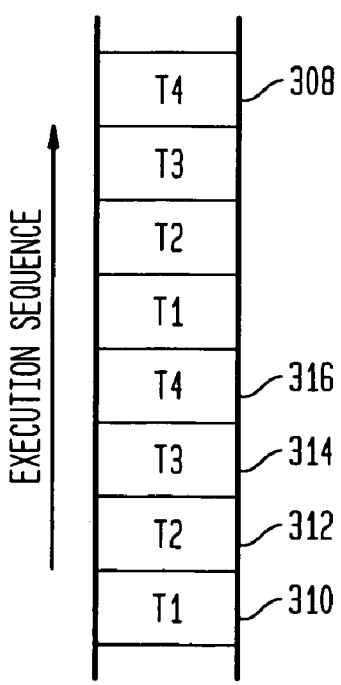
FIG. 10 is a diagram illustrating structure and function of a cycle-by-cycle multithreaded instruction pipeline element of a processor according to an embodiment of the invention.

FIG. 10 illustrates an instruction pipeline 308 which greatly reduces the impact of the above-noted problem. As shown in FIG. 10, instructions awaiting execution in the pipeline 308 belong to different threads. While the instructions of each thread are ordered sequentially within each thread, instructions of each thread are queued such that on each successive instruction cycle, an instruction belonging to a different thread is executed. Thus, during a first cycle, an instruction 310 belonging to a thread T1 is executed. There follows, during a second cycle, the execution of an instruction 312 from a thread T2. During the third cycle, an instruction 314 belonging to a thread T3 is executed, followed by the execution of an instruction 316 belonging to a thread T4 in the fourth cycle. Such pipelining of instructions of different threads for execution in round-robin fashion as described here is known as "cycle-by-cycle multiple threading (or 'multithreading')."

Cycle-by-cycle multithreading benefits the efficiency of the processor, as it makes the execution of instructions more immune from dependencies. Because there are four threads of instructions awaiting execution in the instruction pipeline 308, an unsatisfied dependency (e.g. cache miss) as to an instruction 314 of a particular thread T3 does not cause the execution of other threads T1, T2 and T4 to be suspended. Nor does a wait state as to a particular thread T3 disrupt execution of the other threads. Execution of instructions proceeds as before.

Moreover, cycle-by-cycle multithreading reduces the latency for executing instructions of each thread. As shown in FIG. 10, in an instruction pipeline having a depth of eight instructions and in which multi-threading is provided as to four threads, the latency as to each thread is only two because no more than two instructions of each thread await execution in the instruction pipeline 308 at any one point in time. Moreover, when a new thread, for example, thread T22, loaded into the instruction pipeline 308 in place of a thread T2 having an unsatisfied dependency, at most only two cycles are wasted instead of eight, because instructions belonging to other threads T1, T3 and T4 remain in the pipeline.

Figure 11:
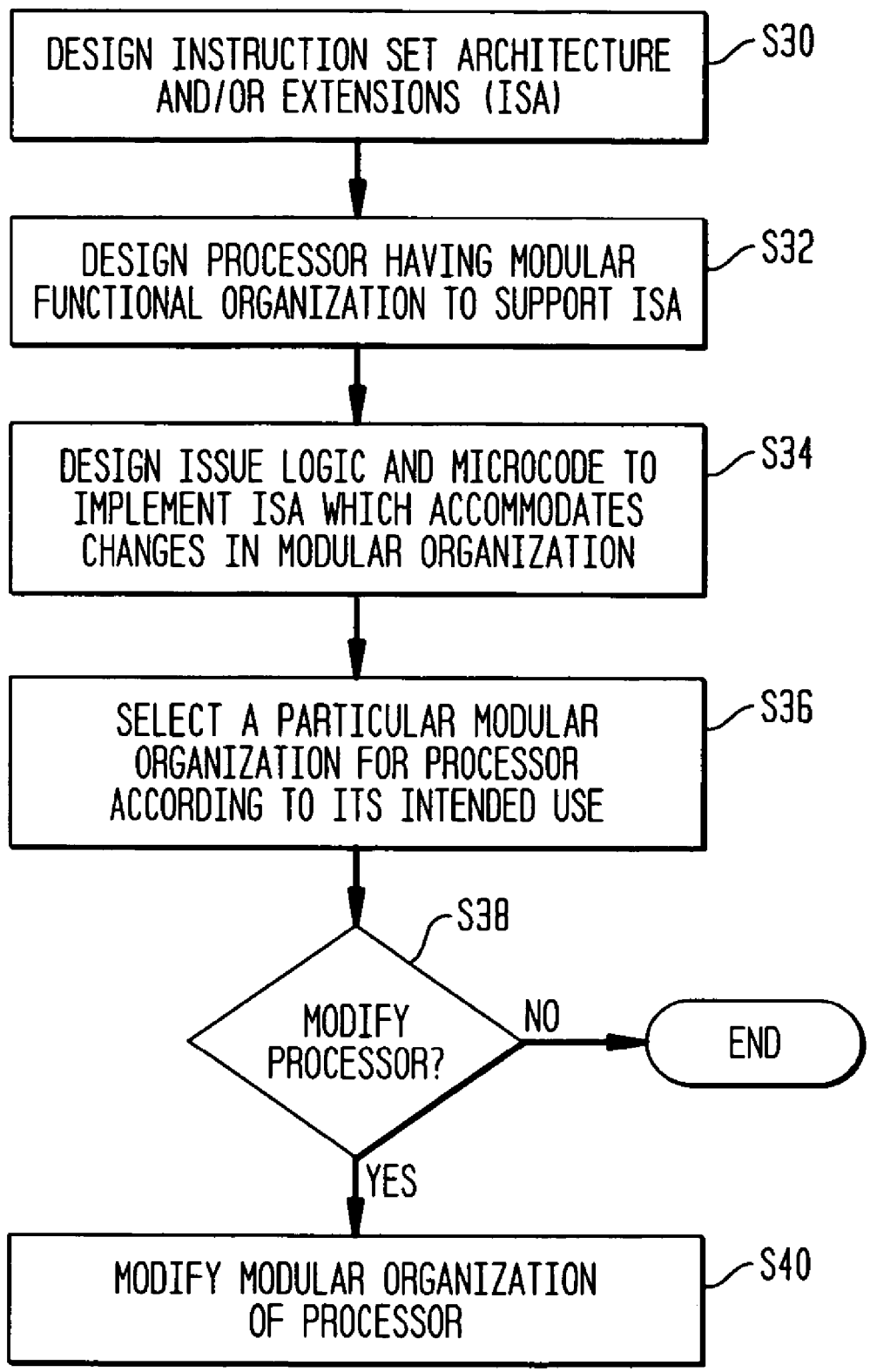
FIG. 11 is a flow diagram illustrating a design method according to an embodiment of the invention.
Figure 12:
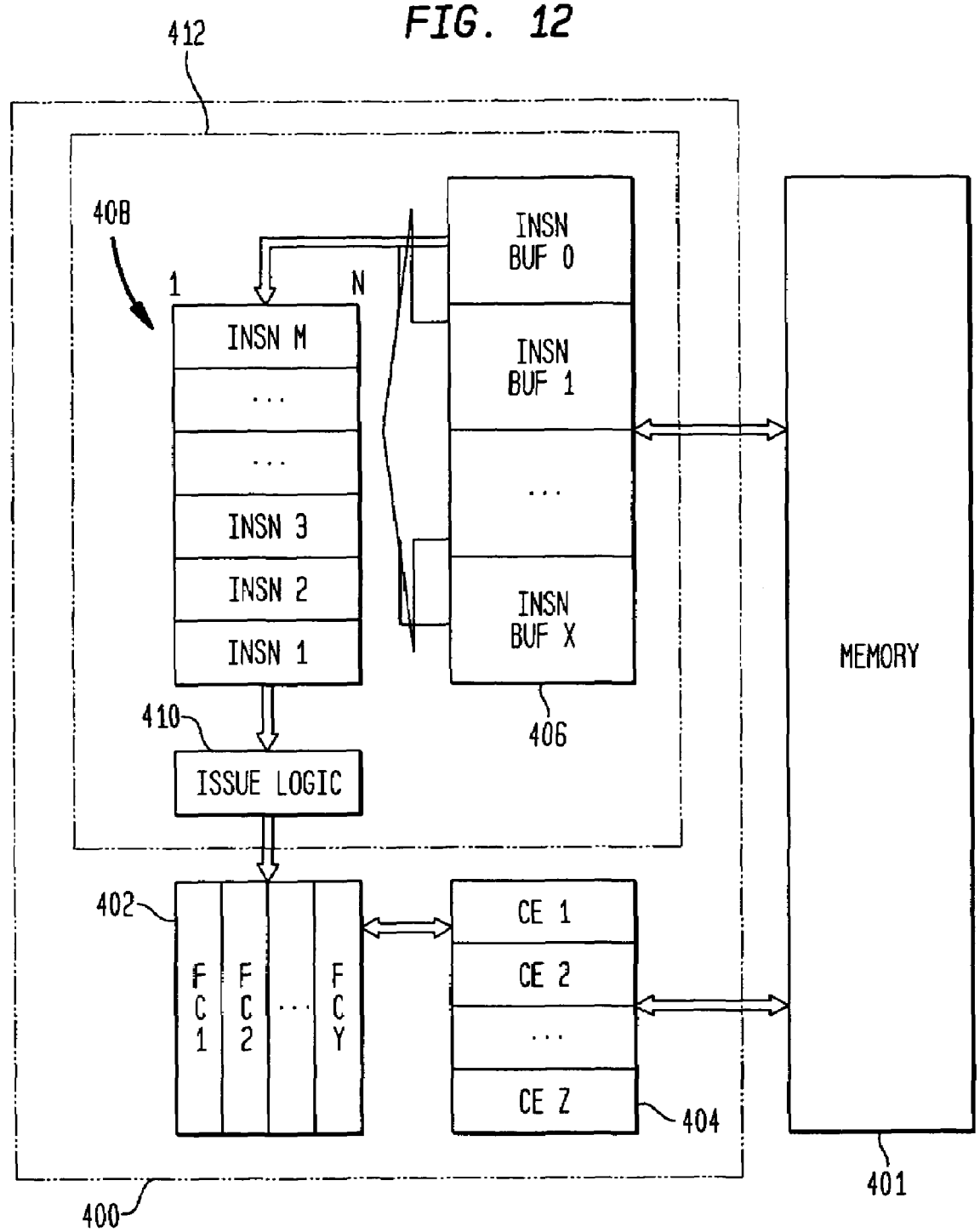
FIG. 12 is a detailed block diagram illustrating organization of a processor designed according to an embodiment of the invention illustrated in FIG. 11.

FIG. 11 is a flowchart illustrating a method of designing a processor according to an embodiment of the invention. FIG. 12 is a block diagram illustrating the organization of a processor designed in accordance with such method. As shown in FIG. 11, a first step in such method is to design an instruction set architecture (ISA) and/or extensions to the ISA, as shown at step S30. Once the ISA has been designed, processor hardware having a modular functional organization which supports the ISA is designed (step S32). The modular elements included within the modular functional organization of the processor include those elements which are subject to being present or not present in the processor, or to being present in different quantities, although such elements can vary in their particular interconnection to other elements. The modular elements of the processor include the number of functional elements, local stores and issue logic units, as shown and described above with reference to FIGS. 4 through 7, as well as the presence or absence of a switch, as shown and described with reference to FIGS. 6 and 7. Thereafter, as shown at step S34, issue logic and microcode are designed for implementing the ISA and which accommodate changes in the modular organization of the processor.

Once these steps are performed, in step S36, a particular modular organization is then selected for the design of a processor, according to the intended use to which it will be put. It is at this step that the number of functional units, number of local stores, issue logic units and/or a switch are selected as part of the organization for a particular processor and the intended use to which it will be put. For example, a processor organization having four functional units, four local stores, no switch, and two issue logic units is selected for a particular use.

Thereafter, according to the particular usage of the processor it is determined whether the processor design should be modified, at step S38. If modification is desired, the modular functional organization of the processor in terms of elements, i.e., the number of functional units, local stores, issue logic units, presence of a switch, etc., are then altered, at step S40. A modified processor design having an altered number of such elements then results. Such new processor design already supports the ISA and has issue logic and microcode available for operating the altered processor design, by virtue of the ISA, issue logic and microcode that are designed from the beginning to support processors having such modular functional organization.

Figure 1:
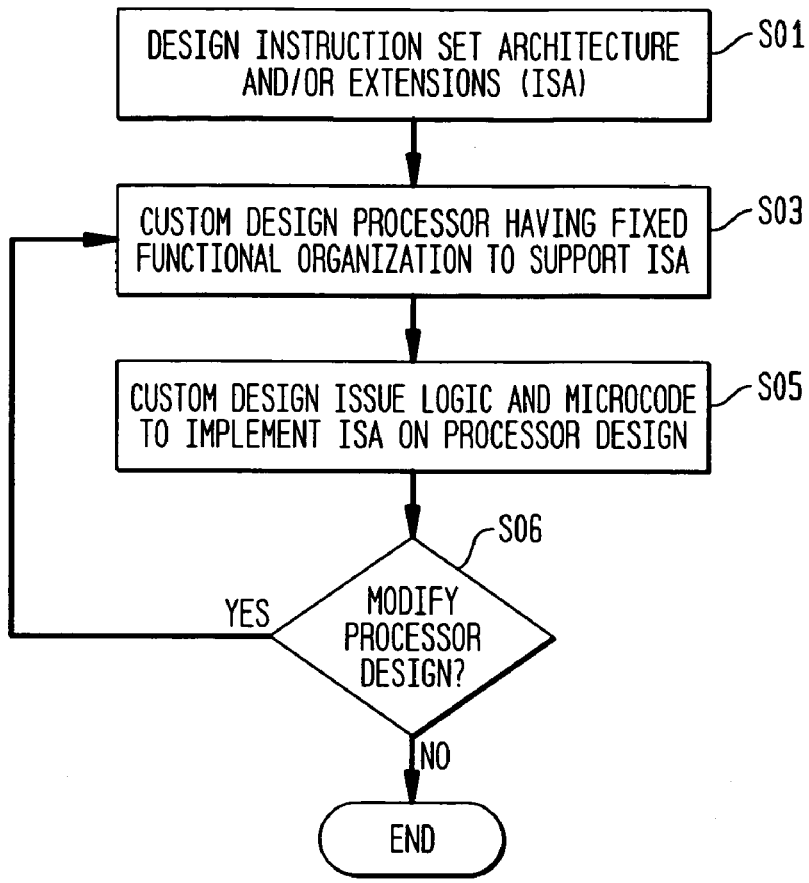
FIG. 1 is a flow diagram illustrating a processor implementation method according to the prior art.
Figure 2:
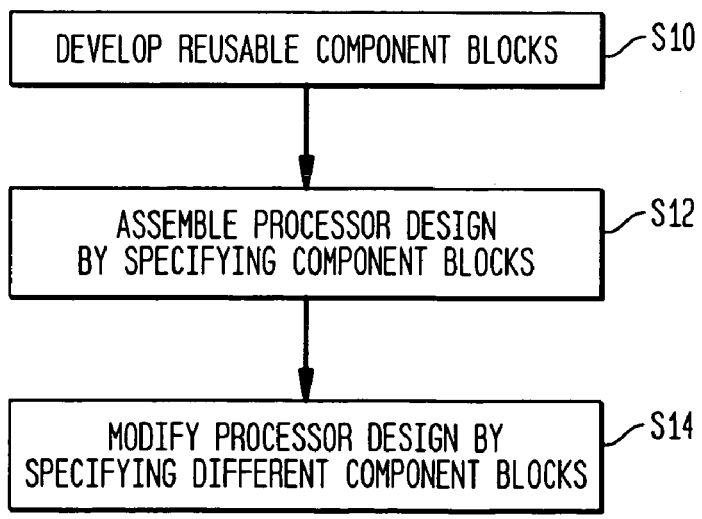
FIG. 2 is a flow diagram illustrating a synthetic design method according to the prior art.
Figure 3:
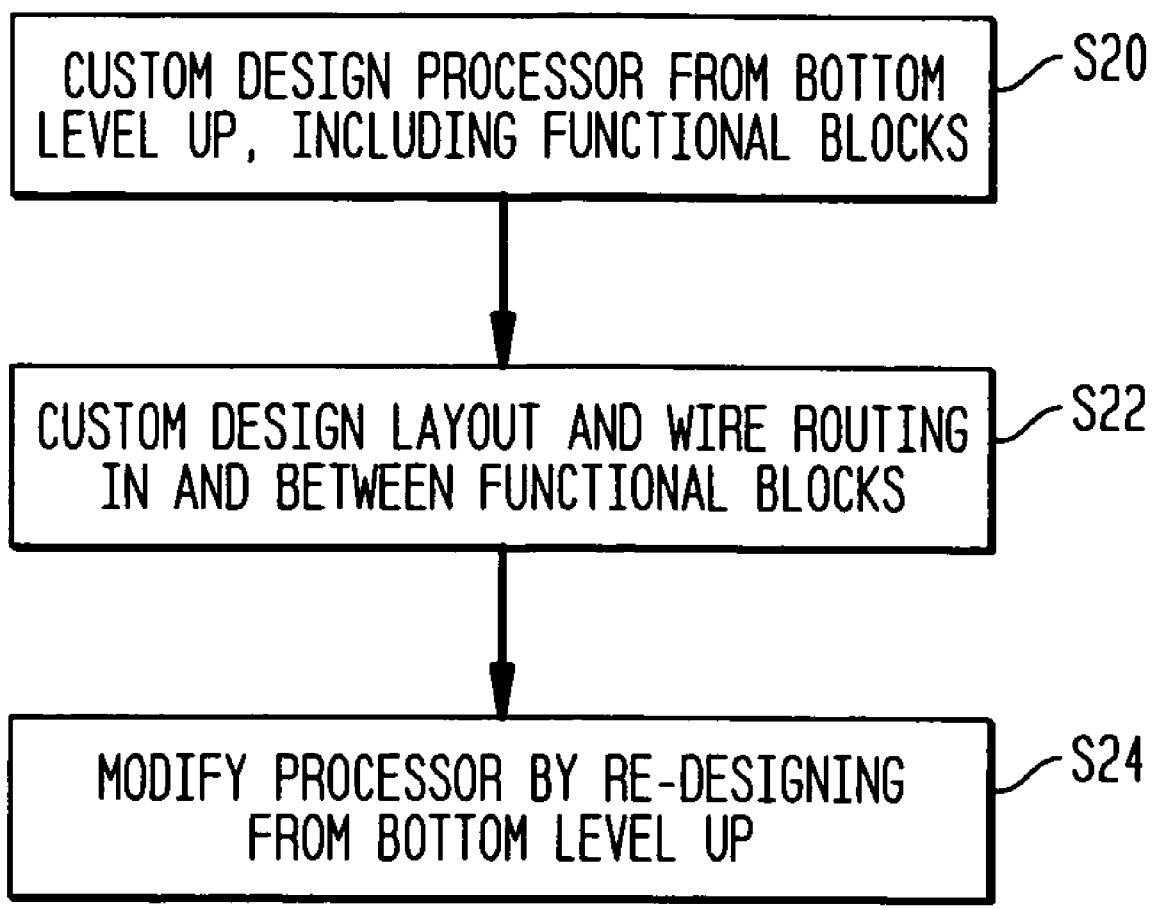
FIG. 3 is a flow diagram illustrating a custom design method according to the prior art.

With reference to FIG. 12, in another embodiment, a processor 400 has an instruction pipeline unit 412 and a cache 404 coupled to a memory 401 for retrieving and storing instructions and data, respectively. The organization of a processor 400 designed by the method disclosed herein varies as a function of the numbers of reusable elements provided to support various functions. Thus, the design of processor 400 includes a cache 404 having a plurality of reusable cache elements CE 1, CE 2, . . . CE Z. The size of the cache is determined by the number of cache elements that are utilized in the design. Each cache element represents a relatively large fractional portion of the total cache, such that the cache element qualifies as a "macro". For example, a cache having a size of 16K double words can have 16 cache elements, each having a size of 1024 double words. Other essential features of the processor are determined by the number of instances of macros of other types. Thus, in an embodiment, an instruction buffer 406 is designed by selecting the number of instances of an instruction buffer macro to as to provide the buffers INSN BUF0, INSN BUF1, . . . INSN BUFX, each of which buffers a stream of instructions for a particular thread. Stated another way, multiple instruction buffers are provided, each of which outputs instructions, in round-robin manner, onto an instruction bus coupled to an instruction pipeline 408. The combination of the multiple instruction buffers INSN BUF1, INSN BUF2, etc., the instruction pipeline 408, and the issue logic 410, form an instruction pipeline unit 412 of the processor 400. Such organization including multiple instruction buffers and common output to the instruction pipeline 408 enables operation according to cycle-by-cycle multi-threading, as described above with reference to FIG. 10. Here, unlike the prior art method described above relative to FIG. 1, it is not necessary for the number of instruction buffers to be determined a priori before commencing design efforts. As each macro is designed to be reusable, the size and capabilities of functional elements of the processor are determined in accordance with the number and interconnection of macros of each type. In addition, the depth M and width N of the instruction pipeline 408 are preferably determined in accordance with the number of instances of macros that support that function of the instruction pipeline 408.

In addition, the capabilities of the functional unit 402 of the processor 400 are determined in accordance with the number of instances FC1, FC2, . . . FCY of a functional unit macro that are provided. Each instance of the functional unit macro preferably implements the function of functional units, as described above with reference to FIGS. 4 through 7. Stated another way, each instance of the functional unit macro has a function of executing a thread. Thus, for a processor organization having a number Y of functional unit macros each handling operands of OP bits each, two benefits can be achieved. First, multi-threading is possible for up to Y instruction streams. Second, operands having a width of up to Y*OP can be handled in one cycle when functional units are operated together as one unit.

The foregoing description as to design methods and processor organization, highlight a flexible, versatile way of designing processors of different sizes and capabilities, which nevertheless share common design features, and are suited to meeting specific performance criteria.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method of designing a processor of an integrated circuit, comprising:
    (a) providing an instruction set architecture (ISA);
    (b) designing a processor having a modular functional organization which supports said ISA, said designing including (i) designing each of a plurality of reusable modular elements for said modular functional organization, each said modular element including a corresponding macro having a predetermined function, and (ii) specifying a number of instances of each said modular element, including selecting a number of instances of each said corresponding macro; and
    (c) designing issue logic to implement said ISA on said processor, said issue logic accommodating changes in said modular functional organization.

2. A method as claimed in claim 1 further comprising designing microcode to implement said ISA on said processor, said microcode accommodating changes in said modular functional organization.

3. A method as claimed in claim 1 further comprising implementing a processor having a particular modular functional organization selected from said modular functional organization.

4. A method as claimed in claim 3 further comprising modifying said particular modular functional organization, wherein said issue logic accommodates said modifying of said particular modular functional organization.

5. A method as claimed in claim 1 wherein said macro corresponding to a modular element includes a first macro having an instruction pipeline function, wherein said step of designing said processor includes designing an instruction pipeline unit including selecting a number of instances of said first macro.

6. A method as claimed in claim 5 wherein said step of designing said instruction pipeline unit includes providing a plurality of instruction stream buffers, each operable to buffer an instruction stream separate from the instruction stream buffered in at least one other said instruction stream buffer, and interconnecting said plurality of instruction stream buffers to said instruction pipeline unit, such that said instruction pipeline unit is operable to provide cycle-by-cycle multiple-threading.

7. A method as claimed in claim 1 wherein said macro corresponding to a modular element includes macro having a cache function, wherein said step of designing said processor includes designing a cache of said processor including selecting a number of instances of said second macro.

8. A method as claimed in claim 7 wherein a size of said cache is selected in accordance with said number of instances of said second macro.

9. A method as claimed in claim 1, wherein said macro corresponding to modular element includes a third-macro having a thread execution function, wherein said step of designing said processor includes designing an instruction execution element of said processor including selecting a number of instances of said third macro.

10. A method as claimed 9, wherein a number of threads capable of simultaneous execution by said instruction execution element is determined in accordance with said selected number of instances of said third macro.

\* \* \* \* \*

UNITED STATES PATENT AND TRADEMARK OFFICE
CERTIFICATE OF CORRECTION

PATENT NO. : 7,302,554 B2
APPLICATION NO. : 11/108959
DATED : November 27, 2007
INVENTOR(S) : Takeshi Yamazaki It is certified that error appears in the above-identified patent and that said Letters Patent is hereby corrected as shown below:

Column 2, line 21 "custom designed" should read --custom-designed--.
Column 12, line 2 after "to" insert --a--.
Column 12, line 7 after "claimed" insert --in claim--.

Signed and Sealed this

Eleventh Day of November, 2008

JON W. DUDAS
*Director of the United States Patent and Trademark Office*